(12) United States Patent
Hur

(10) Patent No.: US 7,605,626 B2
(45) Date of Patent: *Oct. 20, 2009

(54) CLOCK GENERATOR AND CLOCK DUTY CYCLE CORRECTION METHOD

(75) Inventor: Hwang Hur, Kyoungki-do (KR)

(73) Assignee: Hynix Semiconductor Inc., Kyoungki-Do (KR)

( * ) Notice: Subject to any disclaimer, the term of this patent is extended or adjusted under 35 U.S.C. 154(b) by 0 days.

This patent is subject to a terminal disclaimer.

(21) Appl. No.: 12/080,069

(22) Filed: Mar. 31, 2008

(65) Prior Publication Data

US 2008/0204099 A1 Aug. 28, 2008

Related U.S. Application Data

(63) Continuation of application No. 11/323,581, filed on Dec. 29, 2005, now Pat. No. 7,368,966.

(30) Foreign Application Priority Data

Mar. 31, 2005 (KR) .......................... 2005-0027354

(51) Int. Cl.
*H03K 3/017* (2006.01)
*H03K 5/04* (2006.01)
*H03K 7/08* (2006.01)

(52) U.S. Cl. .................. 327/175; 327/172; 327/176

(58) Field of Classification Search ............ 327/31–38, 327/172–176
See application file for complete search history.

(56) References Cited

U.S. PATENT DOCUMENTS

| 6,373,309 | B1 * | 4/2002 | Bang | 327/175 |
| 6,735,669 | B2 * | 5/2004 | Shin | 711/106 |
| 6,815,985 | B2 * | 11/2004 | Jeon | 327/115 |
| 6,853,225 | B2 | 2/2005 | Lee | |
| 6,859,081 | B2 | 2/2005 | Hong et al. | |
| 6,897,693 | B2 * | 5/2005 | Kim | 327/158 |
| 7,046,059 | B2 * | 5/2006 | Kwak | 327/158 |
| 7,057,431 | B2 * | 6/2006 | Kwak | 327/158 |
| 7,142,026 | B2 * | 11/2006 | Kwak | 327/158 |
| 7,368,966 | B2 * | 5/2008 | Hur | 327/175 |
| 2003/0219088 | A1 * | 11/2003 | Kwak | 375/376 |

(Continued)

FOREIGN PATENT DOCUMENTS

JP 2004-129255 4/2004

(Continued)

*Primary Examiner*—Lincoln Donovan
*Assistant Examiner*—Patrick O'Neill
(74) *Attorney, Agent, or Firm*—Blakely, Sokoloff, Taylor & Zafman LLP

(57) ABSTRACT

A clock duty cycle correction (DCC) circuit for correcting a clock duty cycle of an external clock includes a phase comparator for comparing a phase of a rising clock with that of a falling clock to thereby output comparing signal; a DCC controller for outputting a DCC enable signal and a weight selection signal in response to the comparing signal and a first and a second lock state signal; a DCC mixing block for blending the rising clock and the falling clock in response to the DCC enable signal and the weight selection signal to thereby generate a rising and a falling pre-clock signals; and a clock selector for selectively output the rising and the falling pre-clock signals in response to the weight selection signal.

11 Claims, 8 Drawing Sheets

U.S. PATENT DOCUMENTS

| | | |
|---|---|---|
| 2004/0066873 A1 | 4/2004 | Cho et al. |
| 2005/0093600 A1 | 5/2005 | Kwak |

FOREIGN PATENT DOCUMENTS

| | | |
|---|---|---|
| KR | 2000-0044265 | 7/2000 |
| KR | 10-2004-0037786 | 5/2004 |
| KR | 10-2004-0082530 | 9/2004 |

* cited by examiner

CLOCK GENERATOR AND CLOCK DUTY CYCLE CORRECTION METHOD

CROSS-REFERENCE TO RELATED APPLICATION

The present patent application is a continuation of application Ser. No. 11/323,581, filed Dec. 29, 2005 now U.S. Pat. No. 7,368,966.

FIELD OF THE INVENTION

An embodiment of the invention relates to a clock generator; and, more particularly, to a clock generator for reducing a clock duty cycle variation.

DESCRIPTION OF PRIOR ART

A time delay is generated while an external clock signal inputted to a synchronous semiconductor memory device is used as an internal clock signal of the synchronous semiconductor memory device. A delay locked loop (DLL) is employed for synchronizing the internal clock signal with the external clock signal by compensating a clock skew between the internal clock signal and the external clock signal.

Meanwhile, as operation speed of DRAM increases, an efficiency of the DLL affects the performance of the DRAM. In order to increase the efficiency of the DLL, a clock duty cycle of the DLL has to be tightly controlled, as a well-controlled clock duty cycle decreases jitter (which would otherwise degrade the operation speed of the DLL).

FIG. 1 is a block diagram describing a conventional DLL including a clock duty cycle corrector.

As shown, the conventional DLL includes a clock buffer 10, first and second variable delay lines 20 and 30, a pre-clock duty cycle corrector 40, a clock duty cycle corrector 50, a replica delay model 60, a phase detector 70, a mode generator 80, and an output driver 90.

The clock buffer 10 buffers an external clock to thereby output first and second internal clocks clkin1 and clkin2 and a reference clock refclk. Herein, the first and second internal clocks clkin1 and clkin2 have the same phase.

The first variable delay line 20 delays the first internal clock clkin1 in response to a first fine delay control signal FINE, a first coarse delay control signal COARSE, and a first lock state signal lock_state to thereby output a first internal delay signal mixout_r. Herein, the first fine delay control signal FINE and the first coarse delay control signal COARSE are outputted from the phase detector 70; and the first lock state signal lock_state is outputted from the mode generator 80.

The second variable delay line 30 delays the second internal clock clkin2 in response a second fine delay control signal FINEf, a second coarse delay control signal COARSEf, and a second lock state signal lock_statef to thereby output a second internal delay signal mixout_f. Herein, the second fine delay control signal FINEf and the second coarse delay control signal COARSEf are outputted from the phase detector 70; and the second lock state signal lock_statef is outputted from the mode generator 80.

The pre-clock duty cycle corrector 40 buffers the first and second internal delay clocks mixout_r and mixout_f to thereby output a rising clock rclk and a falling clock fclk, respectively. Herein, the rising clock rclk and the falling clock folk have opposite phase.

The clock duty cycle corrector 50 performs a clock duty cycle correction operation to the rising clock rclk and the falling clock fclk to thereby output a rising feedback clock ifbclkr and a falling feedback clock ifbclkf.

The replica delay model 60 models delay elements to generate a compensated rising feedback clock fbclkr and a compensated falling feedback clock fbclkf by respectively compensating the rising feedback clock ifbclkr and the falling feedback clock ifbclkf for a clock skew between the external clock and the rising and falling feedback clocks ifbclkr and ifbclkf. Herein, a delay element corresponds to a delay occurred before the external clock inputted to the first and the second variable delay lines 20 and 30 after inputted from outside and after outputted from the first and the second variable delay lines 20 and 30 until outputted from the output buffer 90.

The phase detector 70 compares the compensated rising and falling signals fbclkr and fbclkf with the reference clock refclk to thereby output the delay control signals FINE, COARSE, FINEf, and COARSEf.

The mode generator 80 generates the first lock state signal lock_state based on the first fine delay control signal FINE and the first coarse delay control signal COARSE and generates the second lock state signal lock_statef based on the second fine delay control signal FINEf and the second coarse delay control signal COARSEf. Herein, the first and second lock state signals lock_state and lock_statef indicate to the clock duty cycle corrector 50 that the rising and the falling clocks are in a lock state.

The output driver 90 buffers and outputs the rising feedback clock ifbclkr and the falling feedback clock ifbclkf outputted from the clock duty cycle corrector 50.

FIG. 2 is a block diagram showing the conventional clock duty cycle corrector 50 shown in FIG. 1.

As shown, the conventional clock duty cycle corrector 50 includes a phase comparator 52, a DCC controller 54, a DCC mixer 56, and a DCC dummy mixer 58.

The phase comparator 52 compares a phase of a falling edge of the rising clock rclk with that of the falling clock fclk. That is, when the phase of the falling edge of the rising clock rclk leads that of the falling clock fclk, the phase comparator 52 outputs a phase comparing signal PC of a logic level 'H'. On the contrary, when the phase of the falling edge of the falling clock fclk leads that of the rising clock rclk, the phase comparing signal PC becomes a logic level 'L'.

The DCC controller 54 receives the phase comparing signal PC outputted from the phase comparator 52 to thereby output a DCC enable signal DCC_enb for enabling the clock duty cycle correction operation and a weight selection signal weight_sel for determining a weight of the rising clock rclk and the falling clock fclk in response to the first and the second lock state signals lock_state and lock_statef. In detail, when the rising clock rclk and the falling clock fclk are in a lock state, i.e., the first and the second lock state signals lock_state and lock_statef are activated, the DCC enable signal DCC_enb is activated as a logic level 'L'.

The DCC mixer 56 is a block for actually performing the clock duty cycle correction operation by blending the rising clock rclk and the falling clock fclk. The DCC mixer 56 blends the rising clock rclk and the falling clock fclk based on the DCC enable signal DCC_enb and the weight selection signal weight_sel. Herein, when the DCC enable signal DCC_enb is a logic level 'H', the DCC mixer 56 outputs the rising clock rclk as the rising feedback clock ifbclkr. Meanwhile, when the DCC enable signal DCC_enb is a logic level 'L', the DCC mixer 56 blends the rising clock rclk and the falling clock fclk.

FIG. 3 is a schematic circuit diagram depicting the conventional DCC mixer 56 shown in FIG. 2.

As shown, the conventional DCC mixer 56 is provided with two NAND gates, one NOR gate, three inverters, and a plurality of tri-state inverters serially connected to each other. As mentioned above, the conventional DCC mixer 56 performs the clock duty cycle correction operation by blending the rising clock rclk and the falling clock folk based on the weight selection signal weight_sel.

Meanwhile, when a high pulse width of the external clock is relatively large, the DCC mixer 56 corrects the clock duty cycle by using the weight selection signal which will be at a logic level 'L'. On the contrary, when the high pulse width of the external clock is relatively small, the DCC mixer 56 corrects the clock duty cycle by using the weight selection signal which will indicate a logic level 'H'.

FIG. 4 is a schematic circuit diagram showing the conventional DCC dummy mixer 58 shown in FIG. 2.

When the DCC enable signal DCC_enb is at logic level 'H', the conventional DCC dummy mixer 58 outputs the falling clock fclk as the falling feedback clock ifbclkf. On the other hand, when the DCC enable signal DCC_enb is at logic level 'L', the conventional DCC dummy mixer 58 generates the logic level 'H' as the falling feedback clock ifbclkf.

FIG. 5 is a waveform demonstrating an operation of the conventional DLL shown in FIG. 1.

When the high pulse width of the external clock is relatively large (wide high pulse case in FIG. 5), the clock duty cycle of the DLL is about 49% when a skew is slow (FF); about 50% when the skew is typical (TT); and about 47% when the skew is fast (SS). Accordingly, the clock duty cycle variation of the conventional art is about 3% when the high pulse of the external clock is large. Meanwhile, when the high pulse width of the external clock is relatively small (narrow high pulse case in FIG. 5), the clock duty cycle of the DLL is about 52% when the skew is slow(FF); about 44% when the skew is typical (TT); and about 41% when the skew is slow (SS). That is, the clock duty cycle variation of the conventional art is about 11% when the high pulse width of the external clock is relatively small. As shown, in case of the small high pulse width of the external clock, the performance of the clock duty cycle corrector 50 is not efficient.

SUMMARY OF THE INVENTION

An embodiment of the invention is a clock generator for reducing clock duty cycle variation in a narrow high pulse case (e.g. a narrow high pulse as described above). The clock generator may also be used to reduce clock duty cycle variation in other instances.

In accordance with an aspect of the present invention, there is provided an apparatus for correcting a clock duty cycle of an external clock for use in a semiconductor memory device having a DLL including: a phase comparator for comparing a phase of a rising clock with that of a falling clock to thereby output a comparing signal; a clock duty cycle correction (DCC) controller for outputting a DCC enable signal and a weight selection signal in response to the comparing signal and first and second lock state signals; a DCC mixing block for blending the rising clock and the falling clock in response to the DCC enable signal and the weight selection signal to thereby generate rising and falling pre-clock signals; and a clock selector for selectively outputting the rising and the falling pre-clock signals in response to the weight selection signal.

In accordance with another aspect of the present invention, there is provided a method for correcting a clock duty cycle of an external clock for use in a semiconductor memory device having a DLL including: comparing a phase of a rising clock with that of a falling clock to thereby output a comparing signal; outputting a clock duty cycle correction (DCC) enable signal and a weight selection signal in response to the comparing signal and first and second lock state signals; blending the rising clock and the falling clock in response to the DCC enable signal and the weight selection signal to thereby generate rising and falling pre-clock signals; and selectively outputting the rising and the falling pre-clock signals in response to the weight selection signal.

In accordance with still another aspect of the present invention, there is provided a clock duty cycle correction (DCC) circuit for correcting a clock duty cycle of an external clock including: a phase comparator for comparing a phase of a rising clock with that of a falling clock to thereby output a comparing signal; a DCC controller for outputting a DCC enable signal and a weight selection signal in response to the comparing signal and first and second lock state signals; a DCC mixing block for blending the rising clock and the falling clock in response to the DCC enable signal and the weight selection signal to thereby generate rising and falling pre-clock signals; and a clock selector for selectively outputting the rising and the falling pre-clock signals in response to the weight selection signal.

BRIEF DESCRIPTION OF THE DRAWINGS

The above and other objects and features of the present invention will become apparent from the following description of preferred embodiments taken in conjunction with the accompanying drawings, in which.

DETAILED DESCRIPTION OF INVENTION

Hereinafter, a clock generator including a clock duty cycle corrector in accordance with the different embodiments of the invention will be described in detail referring to the accompanying drawings.

Figure 1:
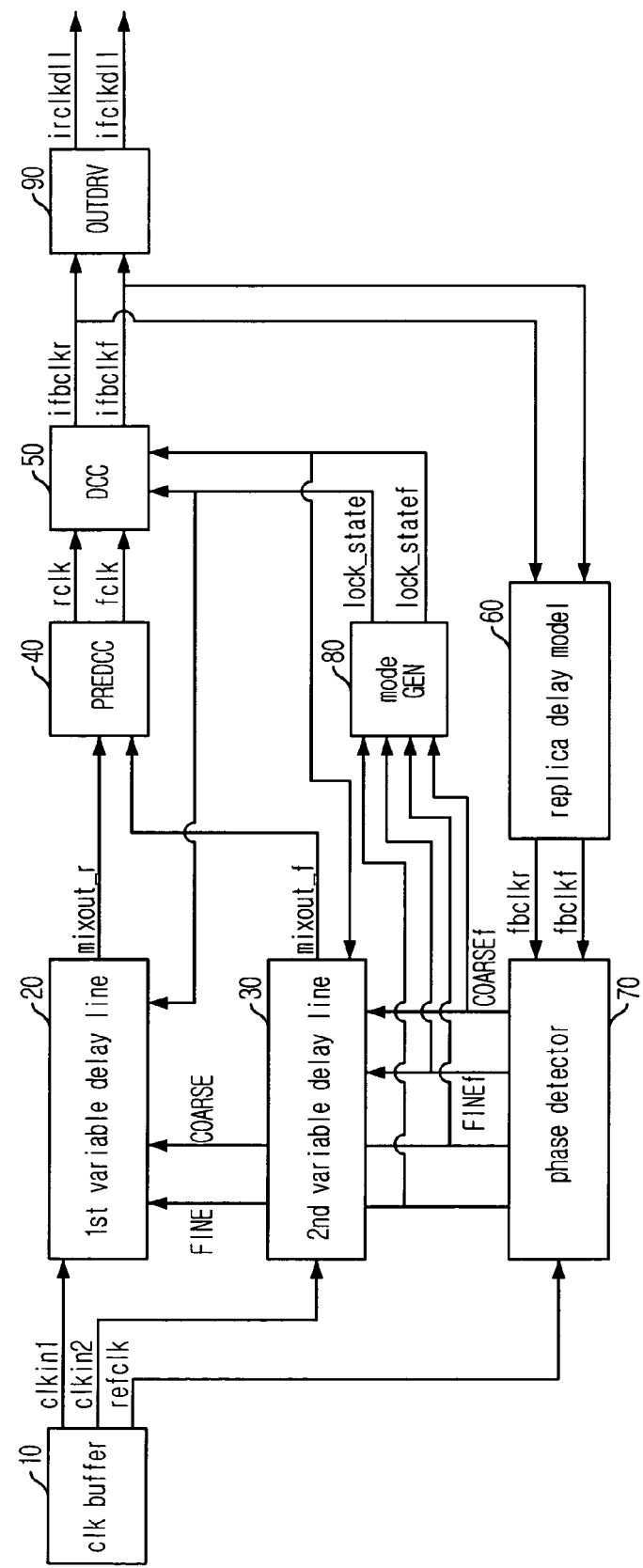
FIG. 1 is a block diagram describing a conventional DLL including a clock duty cycle corrector.
Figure 2:
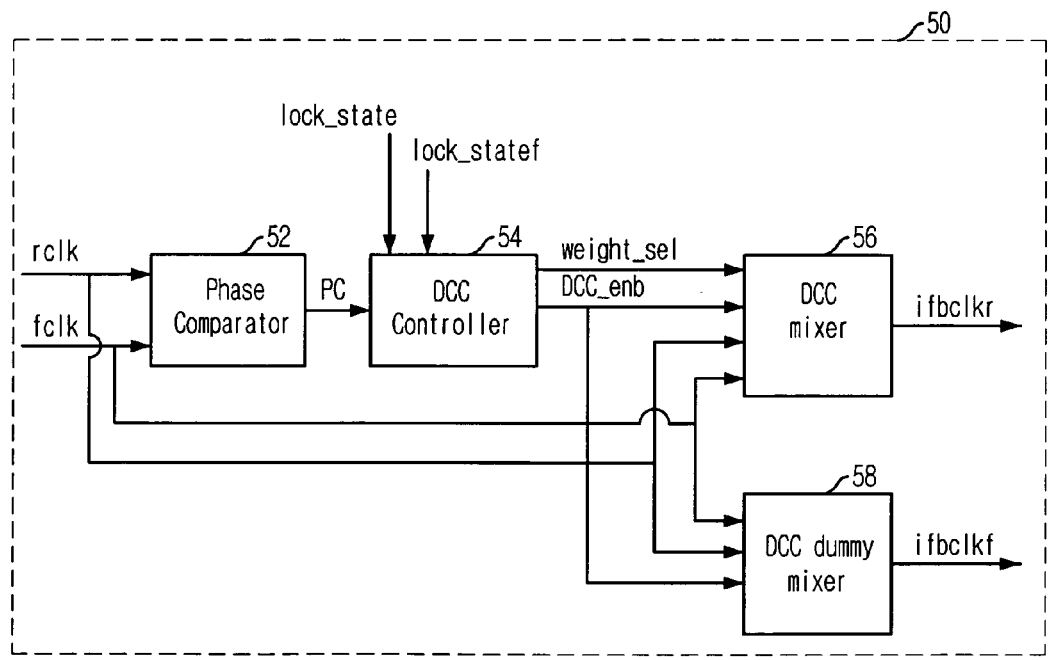
FIG. 2 is a block diagram showing a conventional clock duty cycle corrector shown in FIG. 1.
Figure 3:
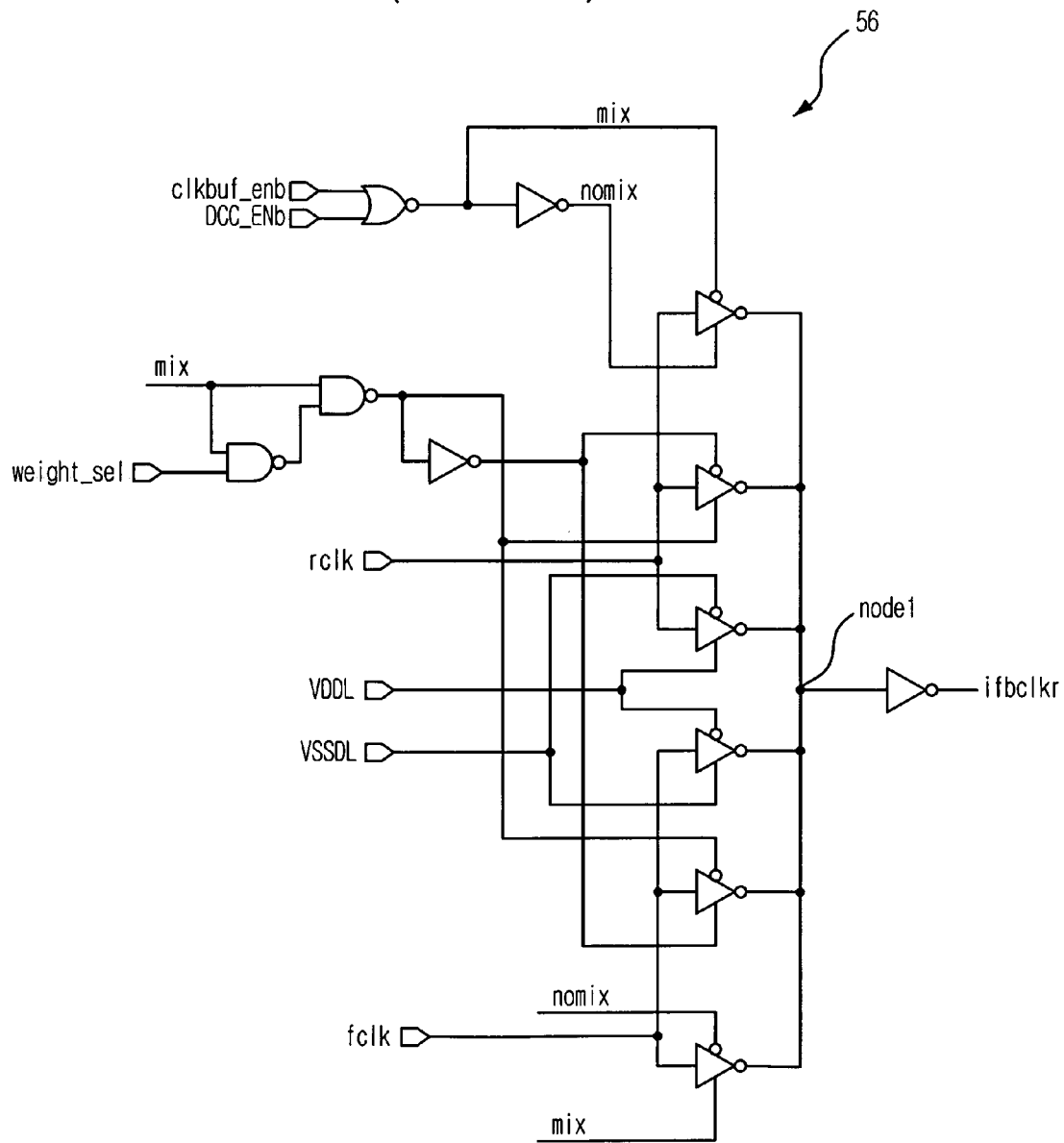
FIG. 3 is a schematic circuit diagram depicting a conventional DCC mixer shown in FIG. 2.
Figure 4:
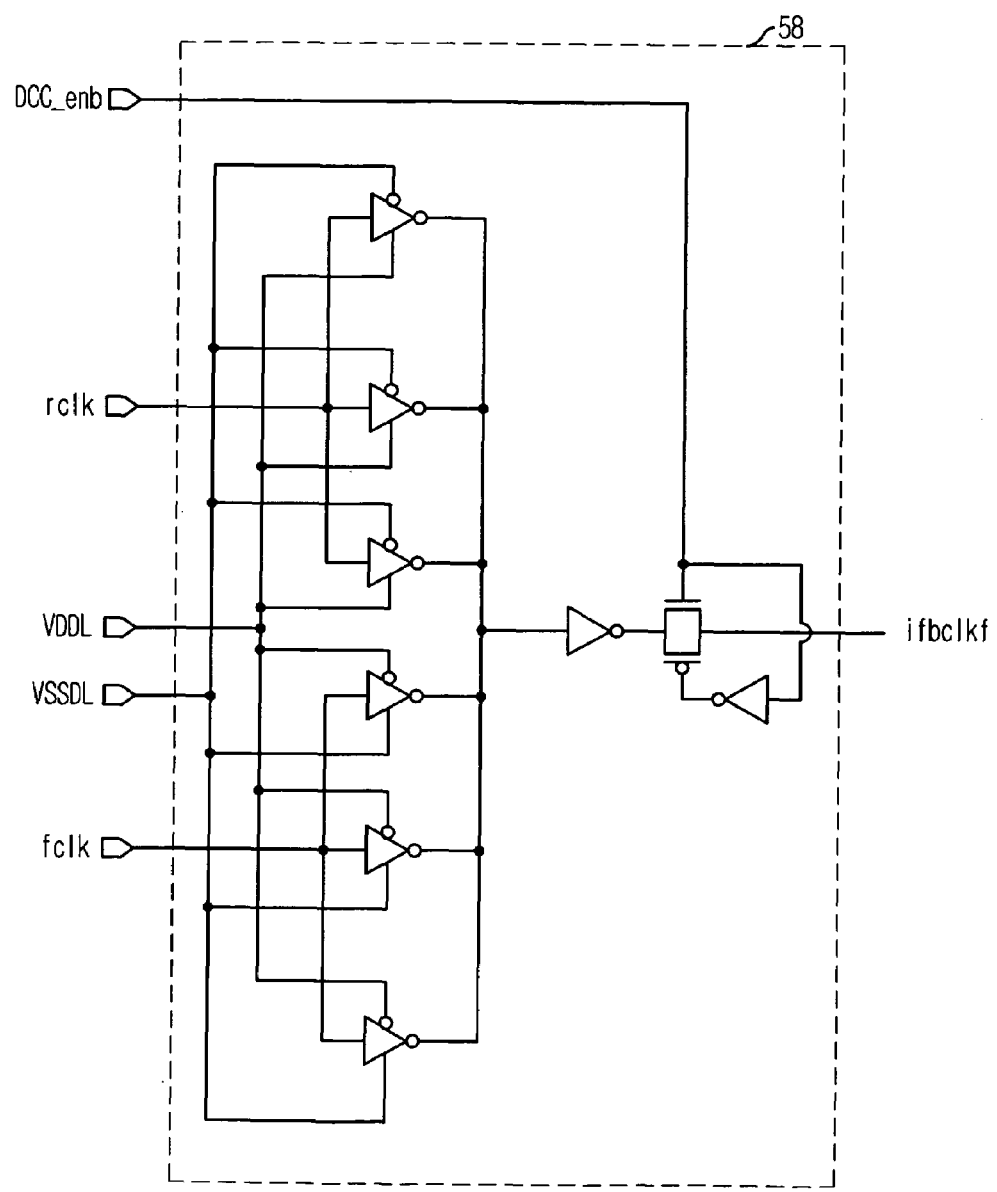
FIG. 4 is a schematic circuit diagram showing a conventional DCC dummy mixer shown in FIG. 2.
Figure 5:
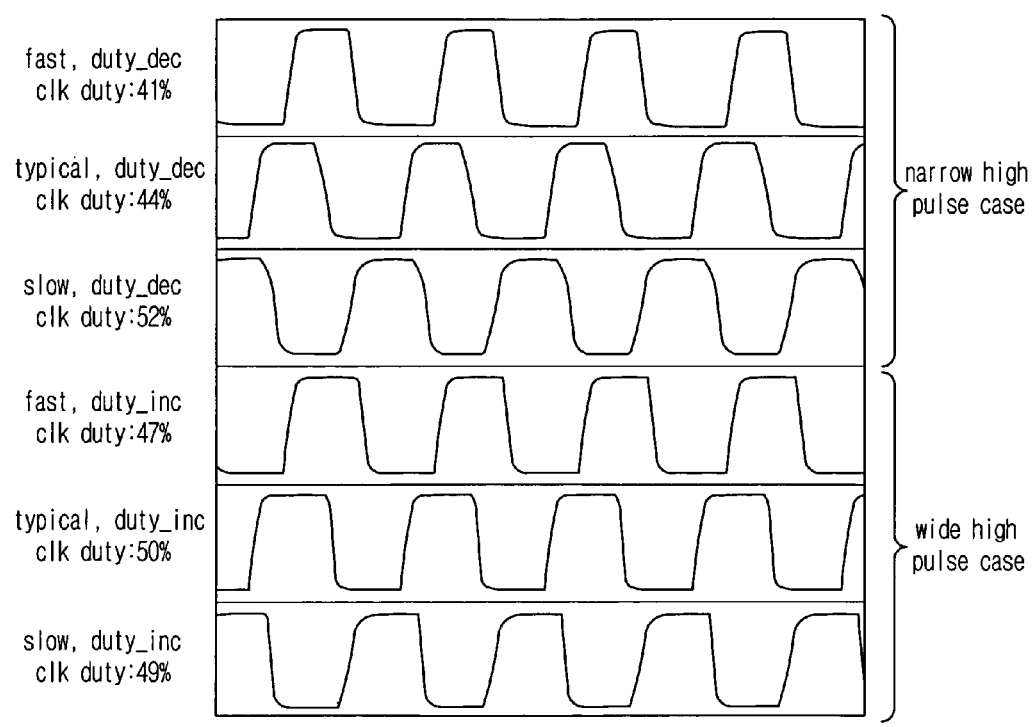
FIG. 5 shows waveforms demonstrating an operation of the conventional DLL shown in FIG. 1.
Figure 6:
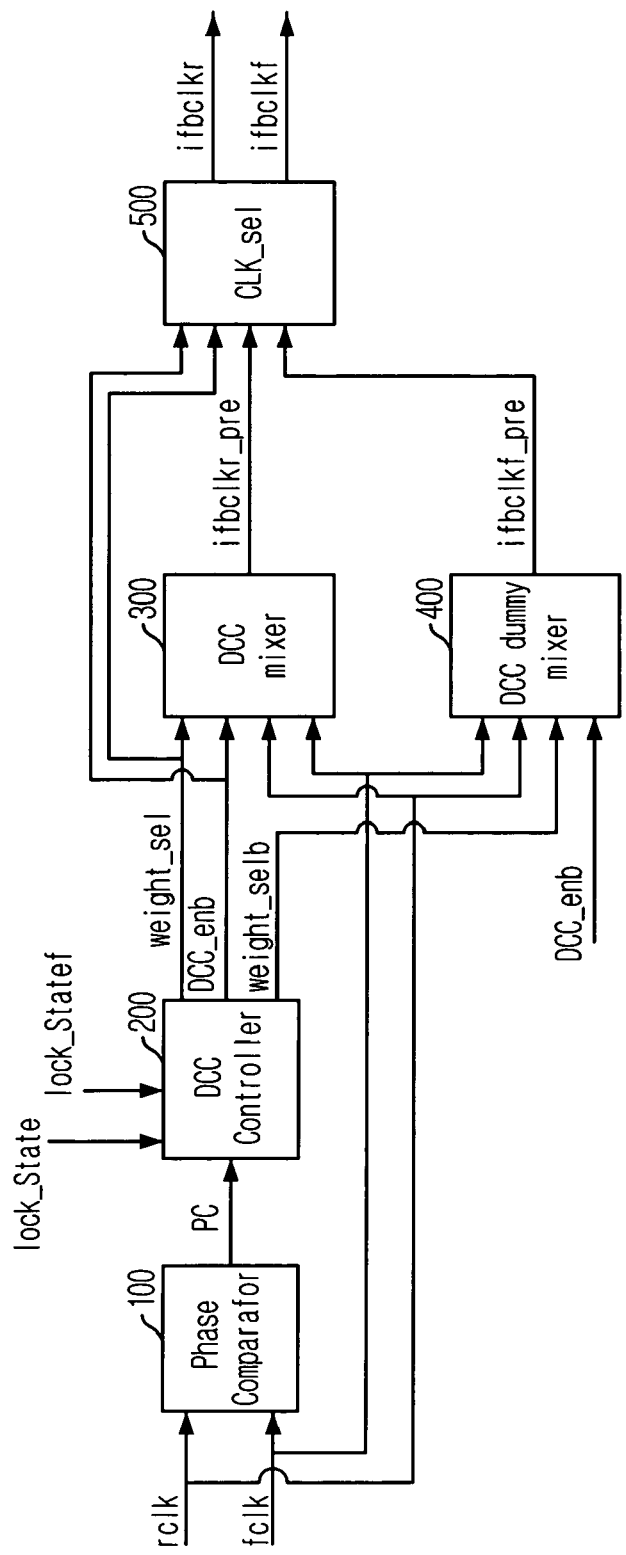
FIG. 6 is a block diagram describing a clock duty cycle corrector in accordance with an embodiment of the invention.

FIG. 6 is a block diagram describing a clock duty cycle corrector in accordance with an embodiment of the invention.

The clock duty cycle corrector includes a phase comparator 100, a DCC controller 200, a DCC mixer 300, a DCC dummy mixer 400, and a clock selector 500.

The phase comparator 100 is similar to the conventional phase comparator 52. That is, the phase comparator 100 of the present invention compares a phase of a falling edge of a rising clock rclk with that of a falling edge. According to an embodiment of the present invention, when the falling edge of the rising clock leads that of the falling clock, the phase comparator 100 outputs a phase comparing signal PC of a logic level 'H'. On the other hand, when the falling edge of the falling clock leads that of the rising clock, the phase comparing signal PC becomes a logic level 'L'.

The DCC controller 200 outputs a DCC enable signal, a weight selection signal, and an inverted weight selection signal (weight_selb). In detail, the DCC controller 200 activates the DCC enable signal DCC_enb as a logic level 'L' in response to an activation of the first and second lock state signals lock_state and lock_statef. Further, the weight selection signal weight_sel and the inverted weight selection signal weight_selb are used for determining a weight of the rising clock rclk and the falling clock fclk based on the phase comparing signal PC.

Herein, a logic level of the weight selection signal weight_sel is determined by the high pulse width of an external clock. That is, when the high pulse width is relatively small, the weight selection signal weight_sel becomes a logic level 'H'. Further, when the high pulse width is relatively large, the weight selection signal weight_sel becomes a logic level 'L'.

The DCC mixer 300 and the DCC dummy mixer 400 of the present invention are similar to those of conventional art, respectively.

The DCC mixer 300 of an embodiment of the present invention blends the rising clock rclk and the falling clock fclk based on the DCC enable signal DCC_enb and the weight selection signal weight_sel to thereby output a rising pre-clock signal ifbclkr_pre. In detail, the DCC mixer 300 outputs the rising clock rclk as the rising pre-clock signal ifbclkr_pre, when the DCC enable signal DCC_enb is a logic level 'H'. When DCC_enb is 'L', the DCC mixer 300 blends the rising clock rclk and the falling clock fclk based on the weight selection signal weight_sel to thereby adjust the clock duty cycle in ifbclkr_pre.

The DCC dummy mixer 400 blends the rising clock rclk and the falling clock fclk based on the inverted weight selection signal weight_selb and the DCC enable signal DCC_enb to thereby output a falling pre-clock signal ifbclkf_pre. In detail, the DCC dummy mixer 400 outputs the falling clock fclk as the falling pre-clock signal ifbclkf_pre when the DCC enable signal DCC_enb is a logic level 'H' and, when DCC_enb is 'L', blends the rising clock rclk and the falling clock fclk based on the inverted weight selection signal weight_selb to thereby adjust the clock duty cycle in ifbclkf_pre. Accordingly, the DCC dummy mixer 400 performs a clock duty cycle correction operation in the opposite way of that of the DCC mixer 300.

Meanwhile, in another embodiment, the DCC controller 200 can be implemented with similar structure of conventional art, and the DCC dummy mixer 400 inverts the weight selection signal weight_sel, to thereby perform the same operation with that of the abovementioned embodiment.

Figure 7:
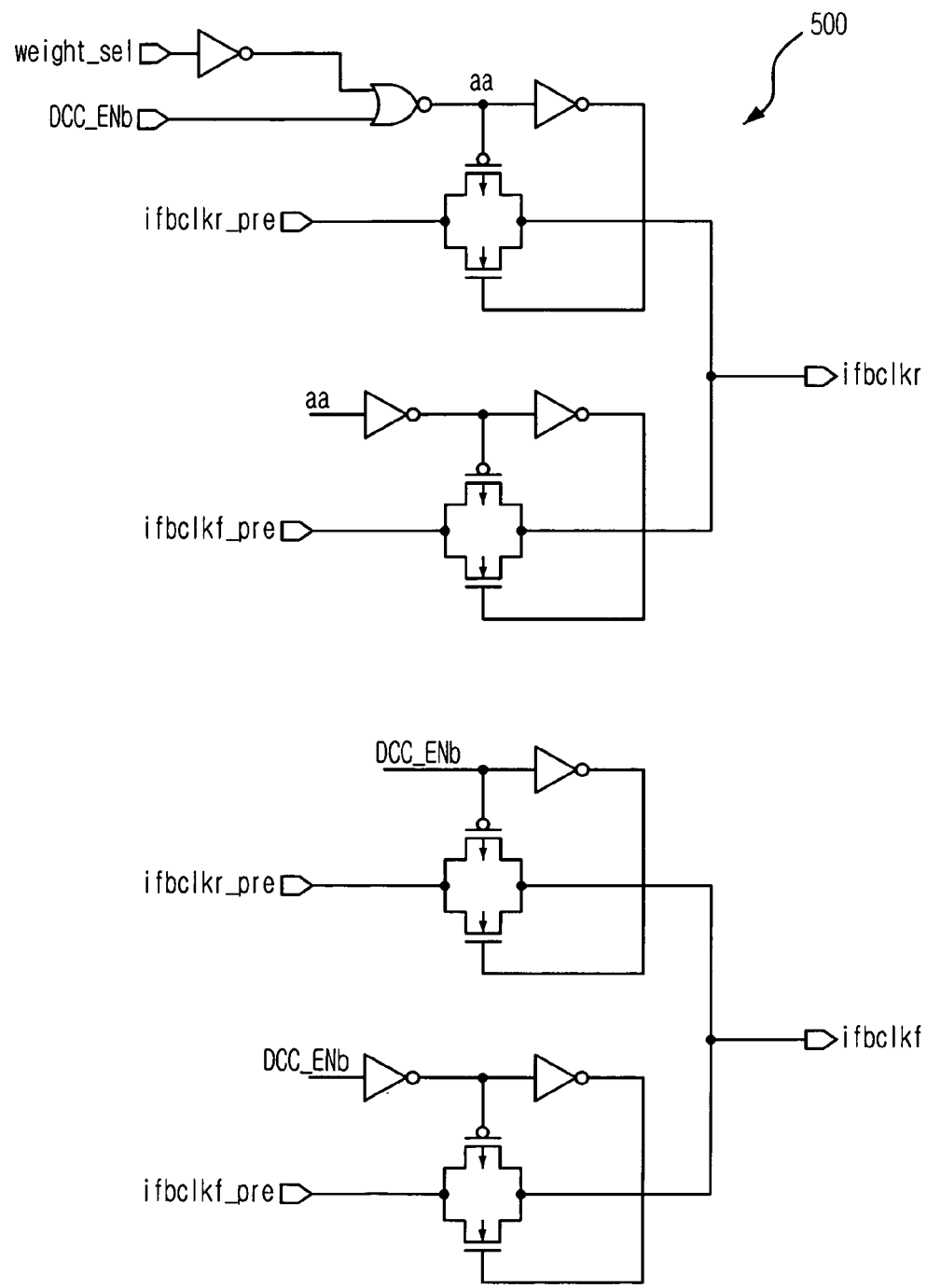
FIG. 7 is a schematic circuit diagram depicting a clock selector shown in FIG. 6.

FIG. 7 is a schematic circuit diagram depicting the clock selector 500 shown in FIG. 6.

When the DCC enable signal DCC_enb is at logic level 'H', the clock selector 500 outputs the rising and the falling pre-clock signals ifbclkr_pre and ifbclkf_pre as rising and falling feedback clocks ifbclkr and ifbclkf, respectively.

Thereafter, when the DCC enable signal DCC_enb becomes logic level 'L', the falling feedback clock ifbclkf is stuck at logic level 'H'; the clock selector 500 selectively outputs the rising and falling clock signals ifbclkr-pre and ifbclkf_pre, as the rising feedback clock ifbclkr, in response to the weight selection signal weight_sel. When the weight selection signal weight-sel is at logic level 'H', the falling pre_clock signal ifbclkf_pre is outputted as the rising feedback clock ifbclkr; on the other hand, when the weight selection signal weight_sel is at logic level 'L', the rising pre_clock ifbclkr_pre is outputted as the rising feedback clock ifbclkr.

Figure 8:
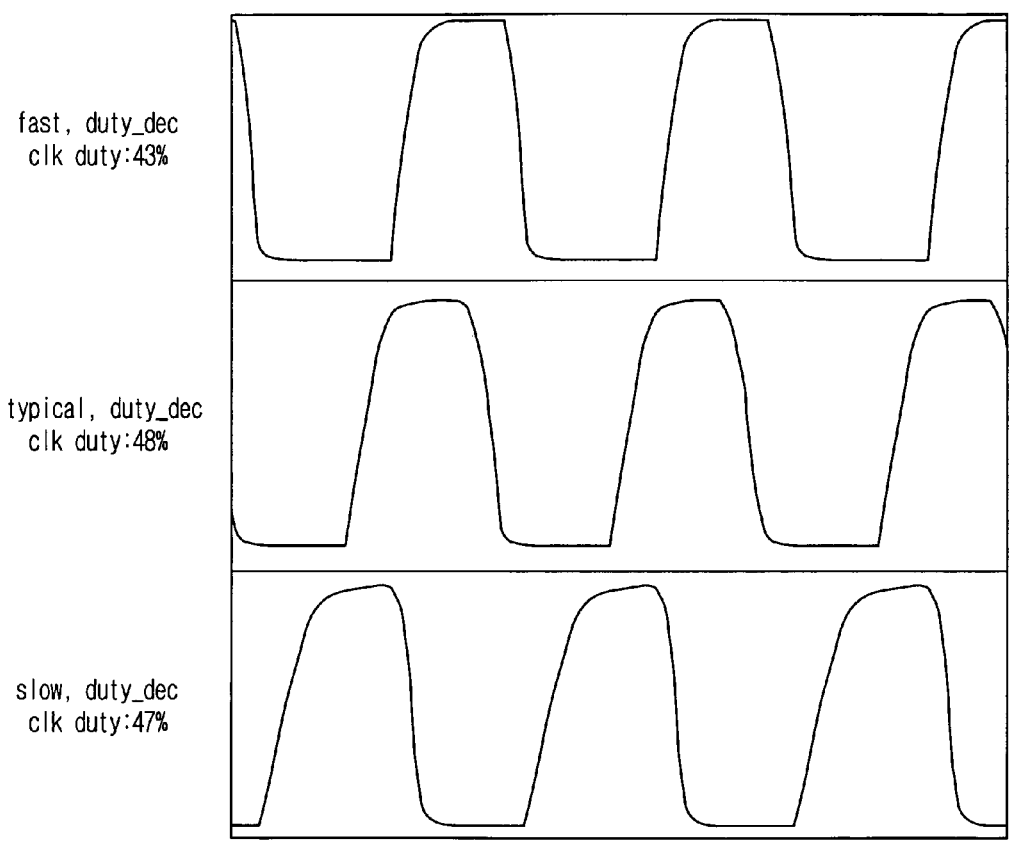
FIG. 8 shows example waveforms demonstrating an operation of the clock duty cycle corrector when a high pulse width of the external clock is small.

FIG. 8 shows example waveforms demonstrating operation of the clock duty cycle corrector when a high pulse width of the external clock is small.

The clock duty cycle of the DLL is about 43% when a skew is fast (FF); about 48% when the skew is typical (TT); and about 47% when the skew is slow (SS). Accordingly, the clock duty cycle variation in this embodiment of the invention is about 5% when the high pulse of the external clock is small.

The clock generator of the different embodiments of the present invention reduces the clock duty cycle variation even though the high pulse of the external clock is small. Further, by using the present invention, jittering factors of the DLL can be also reduced to thereby obtain a high data processing speed.

The present application contains subject matter related to Korean patent application No. 2005-27354, filed in the Korean Patent Office on Mar. 31, 2005, the entire contents of which being incorporated herein by reference.

While the present invention has been described with respect to the particular embodiments, it will be apparent to those skilled in the art that various changes and modifications may be made without departing from the spirit and scope of the invention as defined in the following claims.

What is claimed is:

1. An apparatus for correcting clock duty cycle, comprising:
   a first duty cycle correction (DCC) mixing block configured to mix a rising clock with a falling clock in response to a DCC enable signal and a weight selection signal to thereby generate a rising pre-clock signal;
   a second DCC mixing block configured to mix a falling clock with a rising clock in response to the DCC enable signal and the weight selection signal to thereby generate a falling pre-clock signal; and
   a clock selector for selectively outputting the rising and the falling pre-clock signals in response to the DCC enable signal and the weight selection signal,
   wherein the clock selector outputs the rising pre-clock signal as a rising feedback clock and the falling pre-clock signal as a falling feedback clock when the DCC enable signal is inactivated.

2. The apparatus as recited in claim 1, further comprising:
   a phase comparator configured to compare a phase of the rising clock with a phase of the falling clock to output a comparing signal;
   a clock DCC controller configured to output the DCC enable signal and the weight selection signal in response to the comparing signal.

3. The apparatus as recited in claim 2, wherein the DCC controller outputs the weight selection signal and an inverted weight selection signal.

4. The apparatus as recited in claim 1, wherein the clock selector outputs the falling feedback clock stuck as logic high level and selects one of the rising and falling pre-clocks as the rising feedback clock in response to the weight selection signal when the DCC enable signal is active.

5. The apparatus as recited in claim 1, wherein each of the first and second DCC mixing blocks includes:
   a rising clock mixer for mixing the rising clock with the falling clock based on the DCC enable signal and the weight selection signal to thereby generate the rising pre-clock signal; and
   a falling clock mixer for mixing the rising clock with the falling clock based on the DCC enable signal and the inverted weight selection signal to thereby generate the falling pre-clock signal.

6. The apparatus as recited in claim 1, wherein the clock selector outputs the falling pre-clock signal as the rising feedback clock when the weight selection signal is inactivated and the DCC enable signal is activated and outputs the rising pre-clock signal as the rising feedback clock when the weight selection signal and the DCC enable signal are activated.

7. The apparatus as recited in claim 6, wherein the clock selector includes:
   a first inverter for inverting the weight selection signal;
   a first NOR gate for receiving an output of the first inverter and the DCC enable signal;
   a second inverter for inverting an output of the first NOR gate;
   a third inverter for inverting the DCC enable signal;
   a first transmit gate for transmitting the rising pre-clock signal in response to the output of the first NOR gate;
   a second transmit gate for transmitting the falling pre-clock signal in response to an output of the second inverter;
   a third transmit gate for transmitting the rising pre-clock signal in response to the DCC enable signal; and
   a fourth transmit gate for transmitting the falling pre-clock signal in response to an output of the third inverter.

8. The apparatus as recited in claim 7, in combination with a delay lock loop (DLL) for compensating a clock skew between an external clock applied to the DLL and an internal clock produced by the DLL.

9. A method for correcting clock duty cycle, comprising:
   comparing a phase of a rising clock with a phase of a falling clock to thereby output a comparing signal;
   outputting a clock duty cycle correction (DCC) enable signal and a weight selection signal in response to the comparing signal and first and second lock state signals;
   mixing the rising clock with the falling clock in response to the DCC enable signal and the weight selection signal to thereby generate rising and falling pre-clock signals; and
   selectively outputting the rising and the falling pre-clock signals in response to the weight selection signal and the DCC enable signal,
   wherein the selectively outputting the rising and falling pre-clock signals includes outputting the rising pre-clock signal as a rising feedback clock and outputting the falling pre-clock signal as a falling feedback clock until the DCC enable signal is activated.

10. The method as recited in claim 9, wherein said blending the rising clock and the falling clock includes:
    blending the rising clock and the falling clock based on the DCC enable signal and the weight selection signal to thereby generate the rising pre-clock signal; and
    blending the rising clock and the falling clock based on the DCC enable signal and the weight selection signal to thereby generate the falling pre-clock signal.

11. A clock duty cycle correction (DCC) circuit for correcting clock duty cycle, comprising:
    a phase comparator for comparing a phase of a rising clock with a phase of a falling clock to output a comparing signal;
    a DCC controller for outputting a DCC enable signal and a weight selection signal in response to the comparing signal and first and second lock state signals;
    a DCC mixing block for blending the rising clock and the falling clock in response to the DCC enable signal and the weight selection signal to thereby generate rising and falling pre-clock signals; and
    a clock selector for selectively outputting the rising and the falling pre-clock signals in response to the weight selection signal and the DCC enable signal;
    wherein the selectively outputting the rising and falling pre-clock signals includes outputting the rising pre-clock signal as a rising feedback clock and outputting the falling pre-clock signal as a falling feedback clock until the DCC enable signal is activated.

* * * * *